(12) United States Patent
Lee

(10) Patent No.: US 7,880,257 B2
(45) Date of Patent: Feb. 1, 2011

(54) IMAGE SENSORS INCLUDING PHOTOELECTRIC CONVERTING UNITS HAVING MULTIPLE IMPURITY REGIONS

(75) Inventor: Yun-ki Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/699,525

(22) Filed: Feb. 3, 2010

(65) Prior Publication Data
US 2010/0140731 A1    Jun. 10, 2010

Related U.S. Application Data

(62) Division of application No. 12/180,228, filed on Jul. 25, 2008, now Pat. No. 7,687,875.

(30) Foreign Application Priority Data
Sep. 13, 2007    (KR)    ............ 10-2007-0093286

(51) Int. Cl.
*H01L 31/00* (2006.01)
*H01L 21/00* (2006.01)

(52) U.S. Cl. ............... 257/440; 257/E27.134; 257/E31.054; 257/E31.093; 257/E31.121; 257/E31.122; 257/E31.123; 438/70; 438/73

(58) Field of Classification Search ............... 257/440, 257/E27.134, E31.054, E31.093, E31.121, 257/E31.122, E31.123; 438/70, 73
See application file for complete search history.

(56) References Cited

U.S. PATENT DOCUMENTS

| | | | | |
|---|---|---|---|---|
| 6,044,009 | A | 3/2000 | Goebel et al. ............... 365/149 |
| 6,359,323 | B1 * | 3/2002 | Eom et al. .................. 257/440 |
| 6,548,833 | B1 * | 4/2003 | Lin et al. ..................... 257/89 |
| 6,707,080 | B2 * | 3/2004 | Wang et al. ................. 257/291 |
| 6,756,616 | B2 * | 6/2004 | Rhodes ....................... 257/291 |
| 6,756,618 | B2 * | 6/2004 | Hong .......................... 257/292 |
| 7,342,268 | B2 * | 3/2008 | Adkisson et al. ............ 257/291 |
| 7,452,742 | B2 * | 11/2008 | Kanbe ......................... 438/57 |
| 7,521,315 | B2 | 4/2009 | Kim et al. ................... 438/237 |
| 7,531,374 | B2 | 5/2009 | Kao ............................ 438/57 |
| 7,531,857 | B2 * | 5/2009 | Park ........................... 257/291 |
| 7,535,073 | B2 * | 5/2009 | Ezaki ......................... 257/440 |
| 7,541,627 | B2 * | 6/2009 | Hynecek et al. ............ 257/224 |
| 7,560,674 | B2 * | 7/2009 | Han ............................ 250/200 |
| 7,611,918 | B2 * | 11/2009 | Joon ........................... 438/48 |

(Continued)

FOREIGN PATENT DOCUMENTS

JP    2006-135252    5/2006

(Continued)

*Primary Examiner*—Ida M Soward
(74) *Attorney, Agent, or Firm*—Myers Bigel Sibley & Sajovec, P.A.

(57) ABSTRACT

An image sensor includes a semiconductor layer, and first and second photoelectric converting units including first and second impurity regions in the semiconductor layer that are spaced apart from each other and that are at about an equal depth in the semiconductor layer, each of the impurity regions including an upper region and a lower region. A width of the lower region of the first impurity region may be larger than a width of the lower region of the second impurity region, and widths of upper regions of the first and second impurity regions are equal.

5 Claims, 14 Drawing Sheets

U.S. PATENT DOCUMENTS

| | | | |
|---|---|---|---|
| 7,679,159 B2 * | 3/2010 | Tanaka et al. | 257/440 |
| 2007/0054434 A1 | 3/2007 | Park et al. | 438/48 |
| 2009/0173975 A1 | 7/2009 | Rhodes et al. | 257/292 |
| 2009/0256179 A1 | 10/2009 | Kim | 257/290 |

FOREIGN PATENT DOCUMENTS

| | | |
|---|---|---|
| KR | 1020010002019 A | 1/2001 |
| KR | 1020040036087 A | 4/2004 |
| KR | 1020040042465 A | 5/2004 |

* cited by examiner

IMAGE SENSORS INCLUDING PHOTOELECTRIC CONVERTING UNITS HAVING MULTIPLE IMPURITY REGIONS

CROSS REFERENCE TO RELATED APPLICATION

This application is a divisional of U.S. patent application Ser. No. 12/180,228 filed Jul. 25, 2008 now U.S. Pat. No. 7,687,875 which claims priority from Korean Patent Application No. 10-2007-0093286 filed on Sep. 13, 2007, in the Korean Intellectual Property Office, the disclosures of which are incorporated herein by reference in their entirety.

BACKGROUND

The present invention relates to image sensors and methods of manufacturing the same, and, more particularly, to image sensors that include photo-electric converting units for detecting different wavelengths of light.

An image sensor converts an optical image into an electrical signal. In recent years, with the development of the computer industry and the communication industry, an image sensor that has an improved function has been increasingly demanded for various devices, such as digital cameras, camcorders, PCSs (Personal Communication Systems), game devices, CCTV cameras, medical micro-cameras, and robots.

Some image sensors include color filters to reproduce colors of optical images. In image sensors that include color filters, when Bayer color filters are used, four unit pixels form one pixel group. In this case, the four unit pixels include two unit pixels that correspond to green, and two unit pixels that correspond to red and blue, respectively. That is, neighboring unit pixels are divided into red, green, and blue unit pixels that accumulate charges corresponding to the amount of incident light having wavelengths in the red, green, and blue regions, respectively. Each unit pixel includes a photoelectric-converting unit that accumulates charges corresponding to the amount of incident light.

When the wavelength of incident light is long, the incident light will penetrate more deeply into the semiconductor substrate. The wavelength of red light is longer than the wavelength of green light, which is in turn longer than the wavelength of blue light. Accordingly, in the red unit pixel, the incident light penetrates more deeply into the semiconductor substrate, but in the blue unit pixel, the incident light does not penetrate as deeply into the semiconductor substrate. For this reason, photoelectric-converting units that are provided in all of the unit pixels are formed deeply to collect all of the incident light. However, when impurities that form the photoelectric-converting units are implanted deeply into the semiconductor substrate, it is likely that the impurities will diffuse into adjacent regions. Accordingly, if the photoelectric-converting units are formed to be deep, lower regions of neighboring photoelectric-converting units may be easily connected due to diffusion, and, thus, a phenomenon known as "blooming" may more easily occur.

Alternatively, in order to collect incident light of different wavelengths, the photoelectric-converting units of the unit pixels can be formed to have different depths according to the wavelength of light detected by the pixel. However, in order to form the photoelectric-converting units of all the unit pixels to have different depths, it may be necessary to perform a photomask process at least three times, which can result in lower productivity and/or increased development/manufacturing costs.

SUMMARY

An image sensor according to some embodiments includes a semiconductor layer and first and second photoelectric converting units including first and second impurity regions in the semiconductor layer that are spaced apart from each other and that are at about an equal depth in the semiconductor layer, each of the impurity regions including an upper region and a lower region. A width of the lower region of the first impurity region may be larger than a width of the lower region of the second impurity region, and widths of upper regions of the first and second impurity regions may be about equal. The semiconductor layer may include a semiconductor substrate.

The image sensor may further include a third photoelectric converting unit including a third impurity region in the semiconductor layer that may be spaced apart from the first and second impurity regions in the semiconductor layer. A width of the third impurity region may be about equal to the widths of the upper regions of the first and second impurity regions, and a depth of the third impurity region may be shallower than depths of the first and second impurity regions.

The first impurity region may be configured to accumulate charges corresponding to incident light having a wavelength in the red region, the second impurity region may be configured to accumulate charges corresponding to incident light having a wavelength in the green region, and the third impurity region may be configured to accumulate charges corresponding to incident light having a wavelength in the blue region.

The impurity concentration of the upper region of the first impurity region may be higher than the impurity concentration of the lower region of the first impurity region. The impurity concentration of the upper region of the second impurity region may be higher than the impurity concentration of the lower region of the second impurity region. The impurity concentration may be about equal in the lower regions of the first and second impurity regions.

The spacing between the upper regions of the first and second impurity regions may be smaller than the spacing between the lower regions of the first and second impurity regions. The width of the lower region of the second impurity region may be smaller than the width of the upper region of the second impurity region. The first impurity region and the second impurity region may include impurity regions of the same conductivity type.

An image sensor according to some embodiments includes a semiconductor layer, and a plurality of unit pixels including red unit pixels, green unit pixels, and blue unit pixels in the semiconductor layer. The red, green, and blue unit pixels may be configured to accumulate charges corresponding to incident light having wavelengths in the red, green, and blue regions, respectively. Each of the plurality of unit pixels may include a first impurity region of a first conductivity type that may be configured to accumulate charges corresponding to incident light of a respective wavelength. The red unit pixels include second impurity regions of the first conductivity type below the first impurity regions, and the green unit pixels include third impurity regions of the first conductivity type below the first impurity regions and at about an equal depth as the second impurity regions. The width of the third impurity regions may be smaller than the width of the second impurity regions.

The impurity concentration of the first impurity regions may be higher than the impurity concentration of the second impurity regions and the impurity concentration of the third impurity regions. The impurity concentration of the second impurity regions and the third impurity regions may be about equal.

The first impurity regions may be spaced apart from each other, and a spacing between adjacent ones of the first impurity regions may be smaller than a spacing between adjacent ones of the second impurity regions and the third impurity regions. The width of the third impurity regions may be smaller than a width of the first impurity regions.

Methods of forming an image sensor according to some embodiments include defining red unit pixel regions, green unit pixel regions, and blue unit pixel regions in a semiconductor layer, and forming a mask pattern on the semiconductor layer. The mask pattern includes first openings over the red unit pixel regions and second openings over the green unit pixel regions. The openings over the green unit pixel regions are smaller than the openings over the red unit pixel regions. The methods further include implanting ions into the semiconductor layer using the mask pattern as an ion implantation mask to form first impurity regions of a first conductivity type in portions of the semiconductor layer corresponding to the red unit pixel regions, and to form second impurity regions of the first conductivity type in portions of the semiconductor layer corresponding to the green unit pixel regions. The second impurity regions have a width smaller than a width of the first impurity regions.

Forming the mask pattern may include performing a photolithography process using an optical mask including first light-transmitting portions in regions corresponding to the red unit pixel regions and second light-transmitting portions having a smaller area than the first light-transmitting portions in regions corresponding to the green unit pixel regions.

The methods may further include, after forming the first impurity regions and the second impurity regions, forming third impurity regions of the first conductivity type in portions of the semiconductor layer corresponding to the respective regions. The third impurity regions may be located above the first impurity regions and the second impurity regions.

The methods may further include, before forming the first impurity regions and the second impurity regions, forming third impurity regions of the first conductivity type in portions of the semiconductor layer corresponding to the respective regions. The third impurity regions may be located above the first impurity regions and the second impurity regions.

The impurity concentrations of the first impurity regions and the second impurity regions may be lower than an impurity concentration of the third impurity regions. The depths of the first impurity regions and the second impurity regions may be about equal.

Methods of forming an image sensor according to some embodiments include providing a semiconductor layer, and forming first and second photoelectric converting units including impurity regions in the semiconductor layer spaced apart from each other and at about an equal depth, such that a width of a lower region of the first impurity region is larger than a width of a lower region of the second impurity region, and widths of upper regions of the first and second impurity regions are about equal.

The methods may further include forming a third impurity region spaced apart from the first and second impurity regions in the semiconductor layer. The third impurity region may be formed to have about equal width as the upper regions of the first and second impurity regions and a depth less than depths of the first and second impurity regions.

The impurity concentrations of the upper regions of the first and second impurity regions may be higher than impurity concentrations of the lower regions of the first and second impurity regions.

The impurity concentration of the lower region of the first impurity region may be about equal to the impurity concentration of the lower region of the second impurity region.

The spacing between the upper regions of the first and second impurity regions may be smaller than the spacing between the lower regions of the first and second impurity regions.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
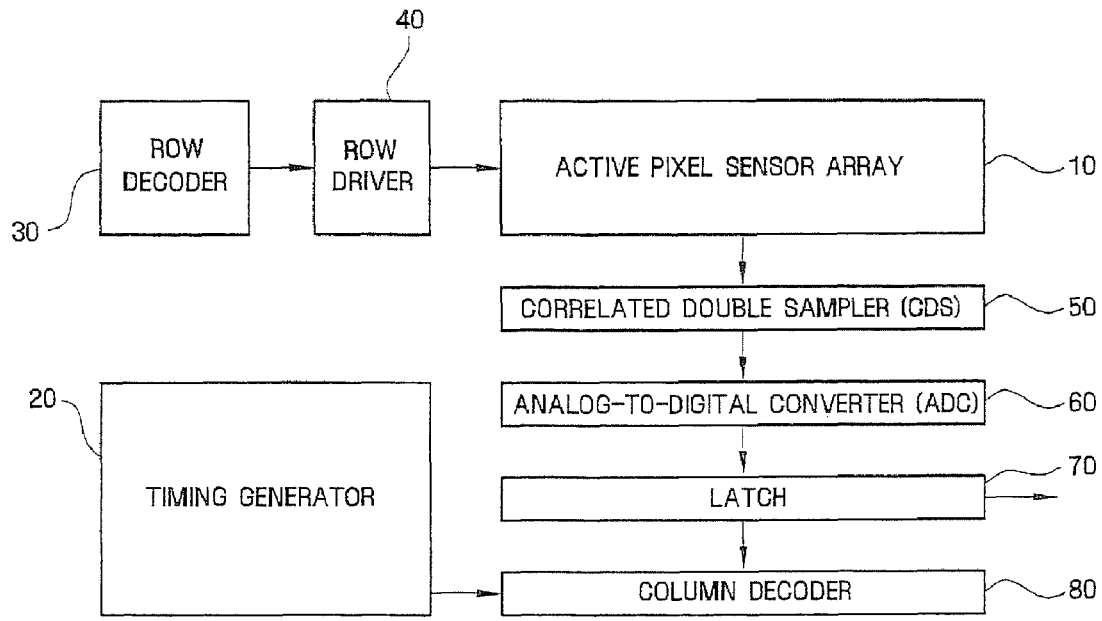
FIG. 1 is a block diagram illustrating an image sensor according to some embodiments.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

FIG. 1 is a block diagram illustrating an image sensor according to some embodiments.

Referring to FIG. 1, an image sensor according to some embodiments of the present invention includes an active pixel sensor array (APS array) 10, a timing generator 20, a row decoder 30, a row driver 40, a correlated double sampler (CDS) 50, an analog-to-digital converter (ADC) 60, a latch 70, and a column decoder 80.

The active pixel sensor array 10 includes a plurality of unit pixels that are arranged two-dimensionally. The plurality of unit pixels convert an optical image into an electrical signal. The active pixel sensor array 10 receives a plurality of driving signals, such as a pixel selection signal ROW, a reset signal RST, and a charge-transfer signal TG, from the row driver 40, and is then driven. Further, the converted electrical signal is applied to the correlated double sampler 50 through a vertical signal line.

The timing generator 20 applies a timing signal and a control signal to the row decoder 30 and the column decoder 80.

The row driver 40 applies a plurality of driving signals to drive a plurality of unit pixels according to the result decoded by the row decoder 30 to the active pixel sensor array 10. In general, when unit pixels are disposed in a matrix, a driving signal is applied for each row.

The correlated double sampler 50 receives an electric signal, which is generated in the active pixel sensor array 10, through a vertical signal line, and holds and samples the electric signal. The correlated double sampler 60 performs double sampling on a specific reference voltage level (hereinafter, referred to as "noise level") and a voltage level (hereinafter, referred to as "signal level") of the generated electric signal, and outputs a difference level between the noise level and the signal level.

The analog-to-digital converter 60 converts an analog signal corresponding to the difference level into a digital signal, and outputs the digital signal.

The latch 70 latches the digital signal, and the latched signal is sequentially output to an image-signal processor (not shown) according to the result decoded by the column decoder 80.

Figure 2:
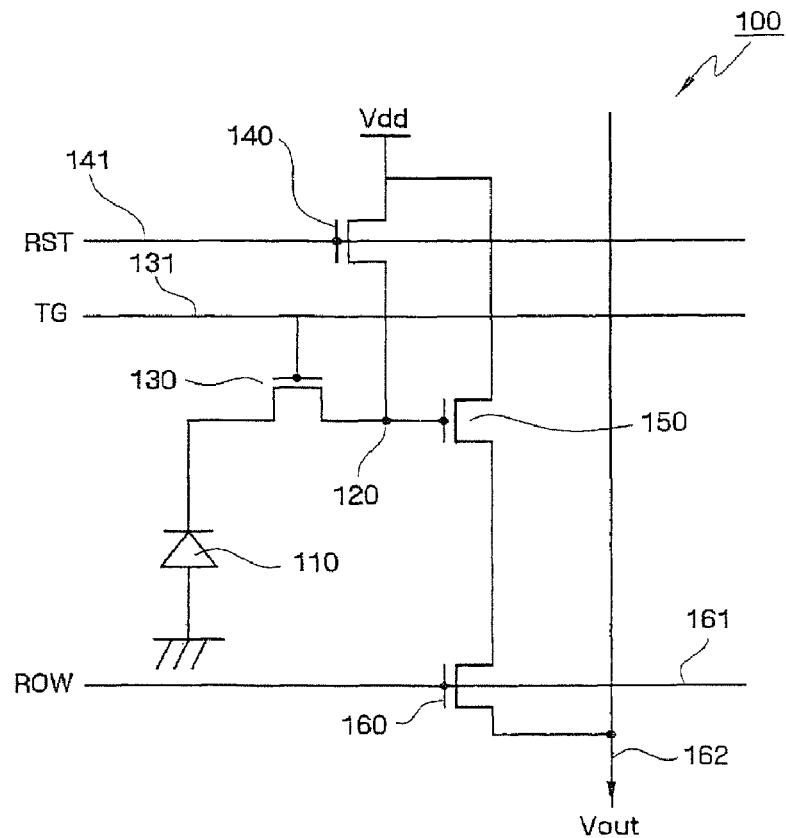
FIG. 2 is a circuit diagram illustrating a unit pixel of an image sensor according to some embodiments.

FIG. 2 is a circuit diagram illustrating a unit pixel of an image sensor according to some embodiments.

Referring to FIG. 2, a unit pixel 100 of the image sensor includes a photoelectric-converting unit 110, a charge-detecting unit 120, a charge-transferring unit 130, a reset unit 140, an amplifying unit 150, and a selecting unit 160. In some embodiments, the unit pixel 100 includes four transistors, as shown in FIG. 2. However, the unit pixel 100 may include five transistors.

The photoelectric-converting unit 110 absorbs incident light and accumulates charges that correspond to a quantity of light. The photoelectric-converting unit 110 may include a photodiode, a phototransistor, a photogate, a pinned photodiode (PPD), and/or a combination thereof.

A floating diffusion region (FD) can be used as the charge-detecting unit 120. The charge-detecting unit 120 receives the charges that are accumulated by the photoelectric-converting unit 110. Since the charge-detecting unit 120 has parasitic capacitance, the charges are accumulated in the charge-detecting unit 120. Further, since the charge-detecting unit 120 is electrically connected to a gate of the amplifying unit 150, the charge-detecting unit 120 controls the amplifying unit 150.

The charge-transferring unit 130 transfers the charges from the photoelectric-converting unit 110 to the charge-detecting unit 120. In general, the charge-transferring unit 130 includes one transistor, and is controlled by a charge-transfer signal TG.

The reset unit 140 periodically resets the charge-detecting unit 120. A source of the reset unit 140 is connected to the charge-detecting unit 120, and a drain thereof is connected to a voltage source VDD. In addition, the reset unit 140 is driven in response to a reset signal RST.

The amplifying unit 150 constitutes a source follower buffer amplifier together with a constant current source (not shown) that is located outside the unit pixel 100. A voltage, which changes in response to a voltage of the charge-detecting unit 120, is output to the vertical signal line 162. A source of the amplifying unit 150 is connected to a drain of the selecting unit 160, and a drain thereof is connected to the voltage source VDD.

The selecting unit 160 selects the unit pixels 100 to be read in a row unit. The selecting unit 160 is driven in response to a selection signal ROW, and a source thereof is connected to a vertical signal line 162.

Further, driving signal lines 131, 141, and 161 of the charge-transferring unit 130, the reset unit 140, and the selecting unit 160 extend in a row direction (horizontal direction) such that unit pixels included in the same row are driven simultaneously.

Figure 3A:
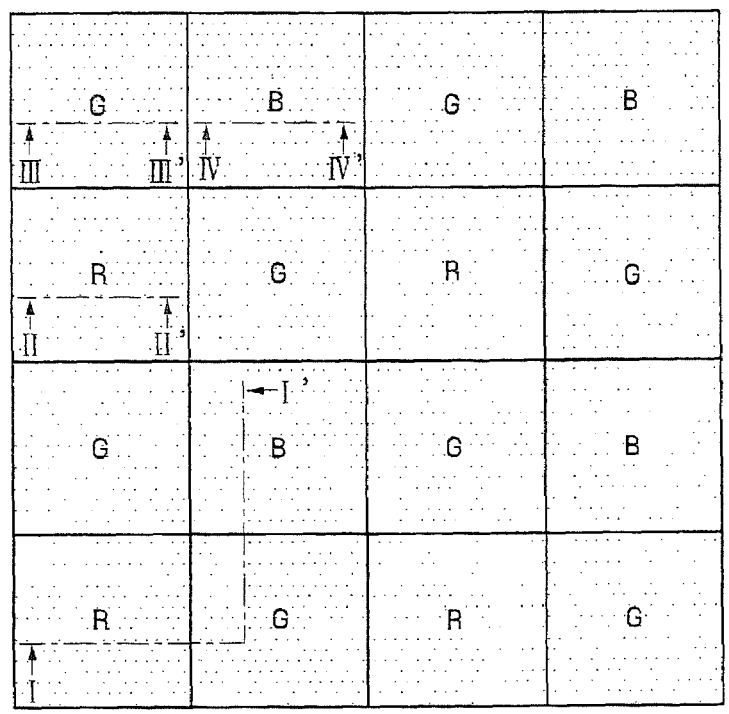
FIG. 3A is a layout diagram illustrating color filters of an image sensor according to some embodiments.
Figure 3B:
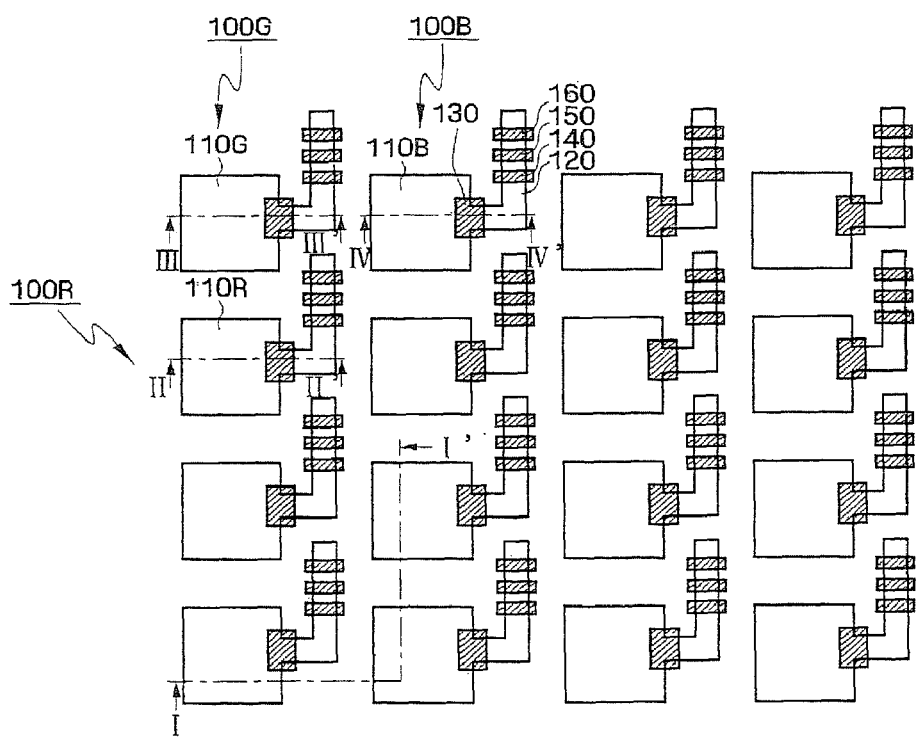
FIG. 3B is a schematic plan view illustrating an active pixel sensor array of an image sensor according to some embodiments.
Figure 4:
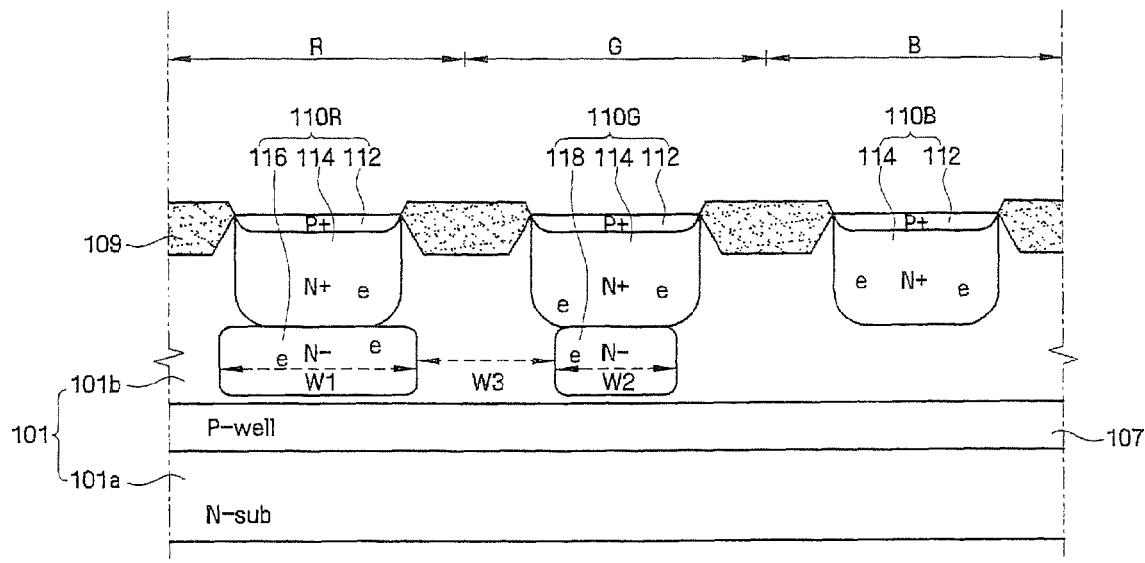
FIG. 4 is a cross-sectional view taken along the line I-I' of FIGS. 3A and 3B.
Figure 5A:
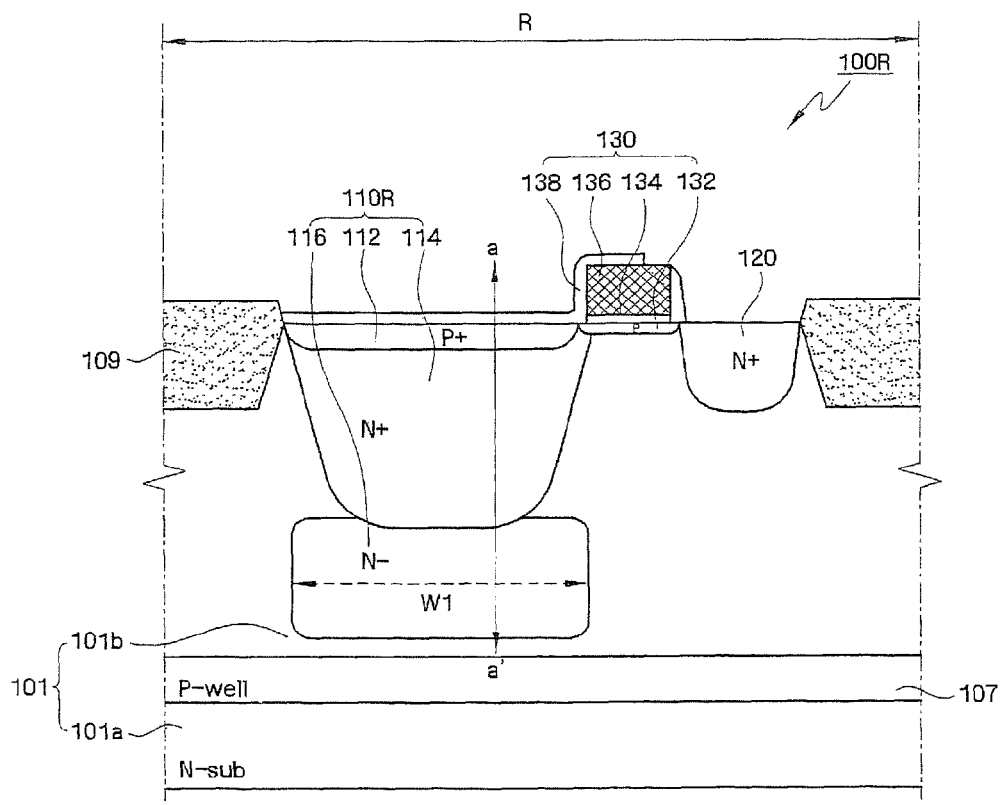
FIG. 5A is a cross-sectional view taken along the line II-II' of FIGS. 3A and 3B.
Figure 5B:
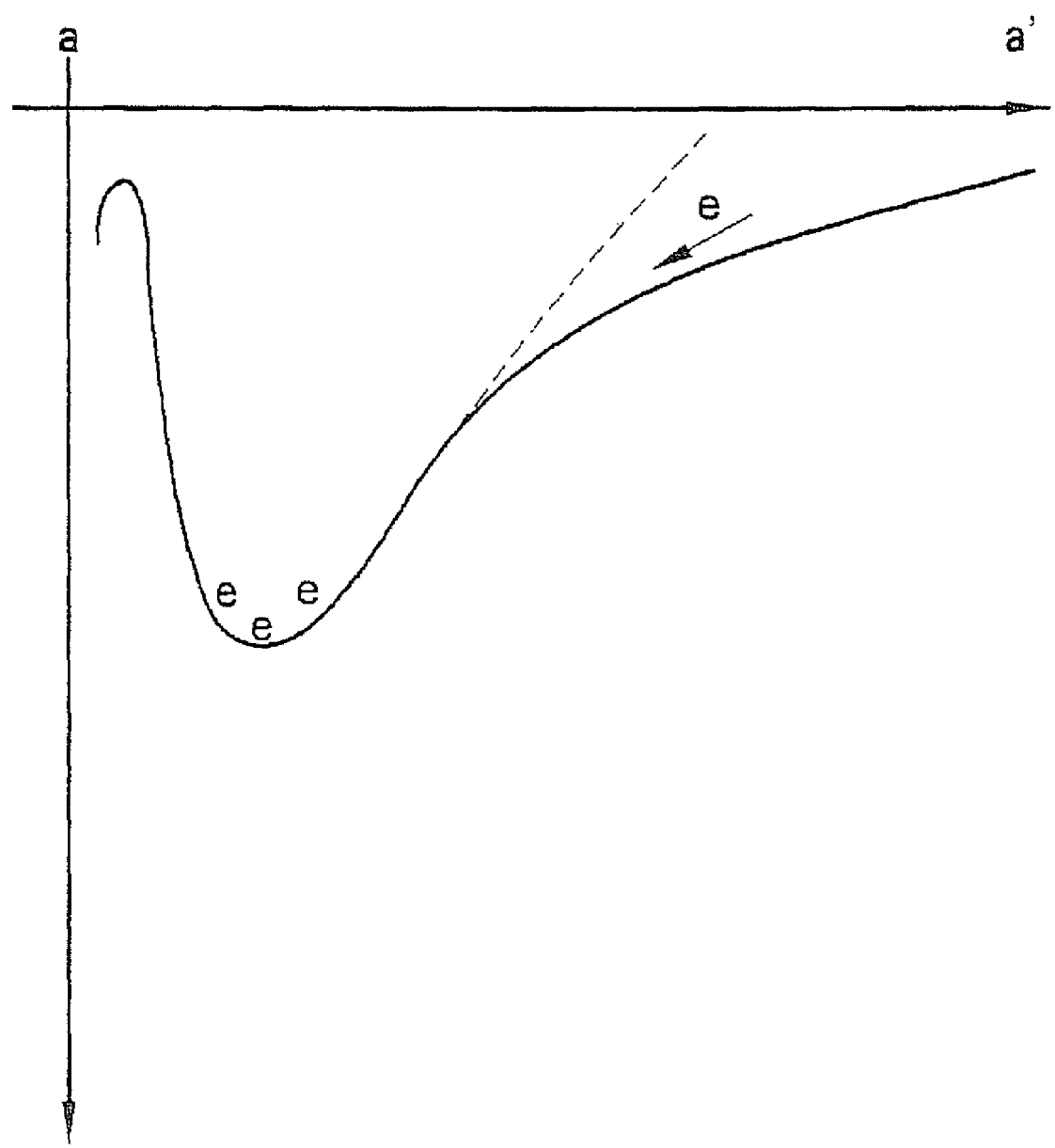
FIG. 5B is a potential diagram taken along the line a-a' of FIG. 5A.
Figure 6A:
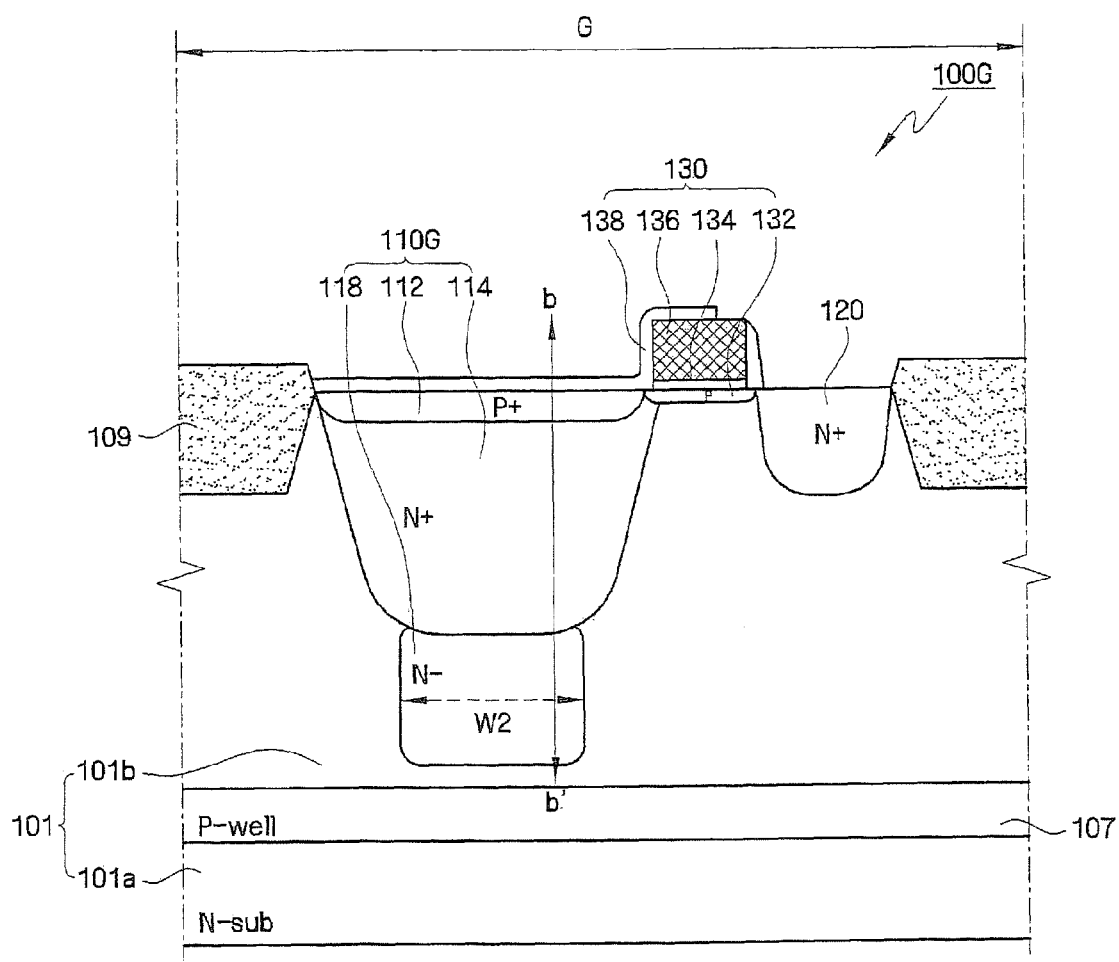
FIG. 6A is a cross-sectional diagram taken along the line III-III' of FIGS. 3A and 3B.
Figure 6B:
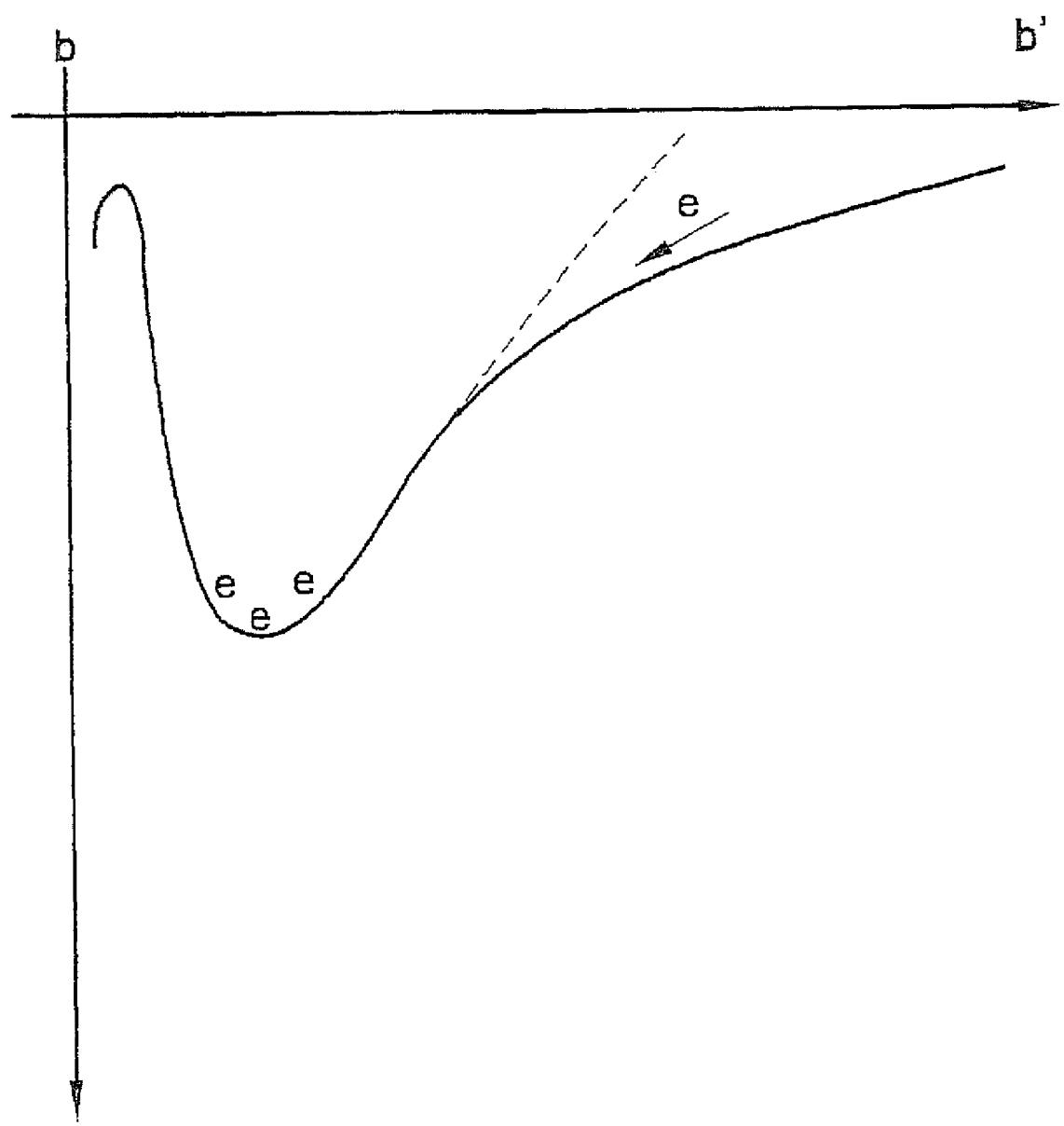
FIG. 6B is a potential diagram taken along the line b-b' of FIG. 6A.
Figure 7A:
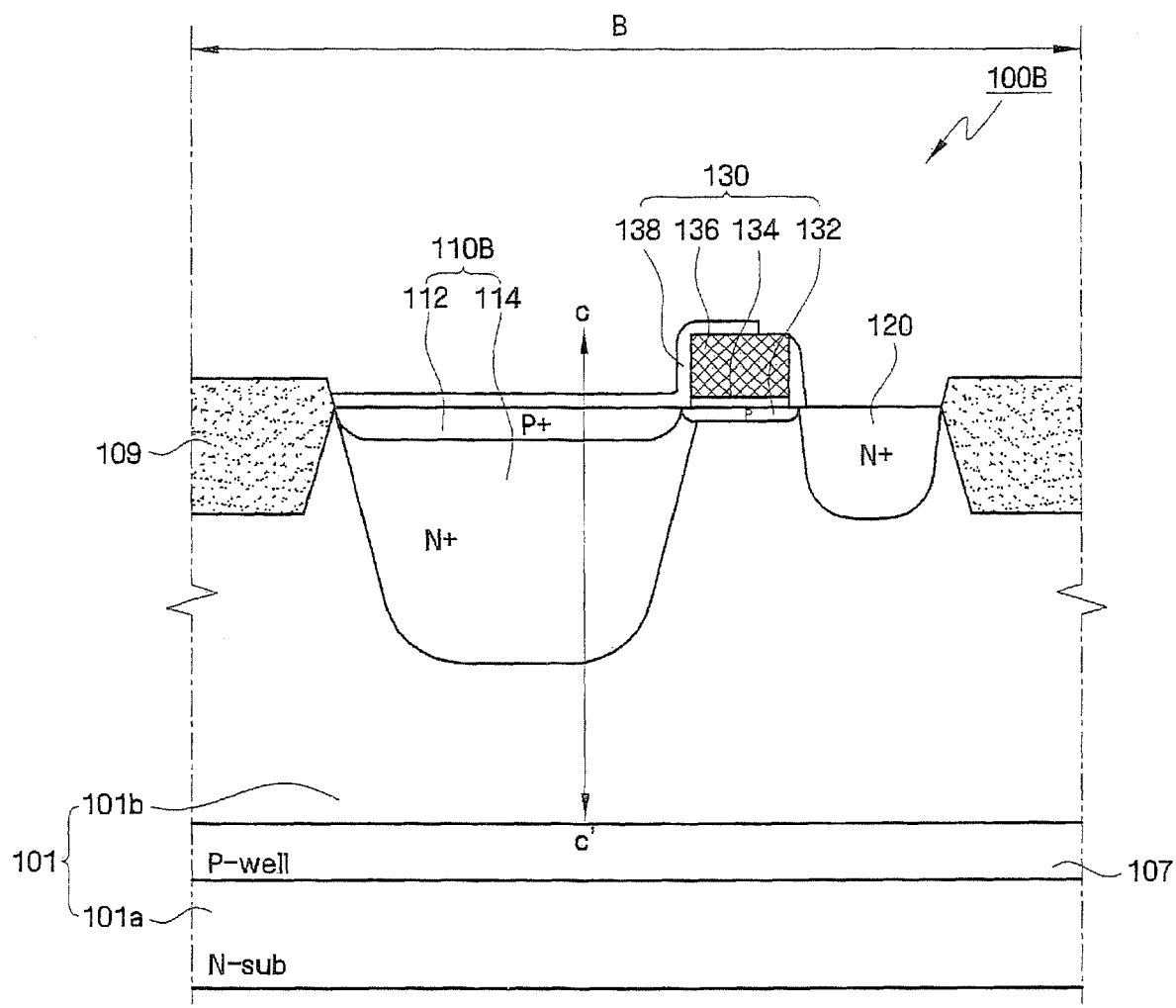
FIG. 7A is a cross-sectional view taken along the line IV-IV' of FIGS. 3A and 3B.
Figure 7B:
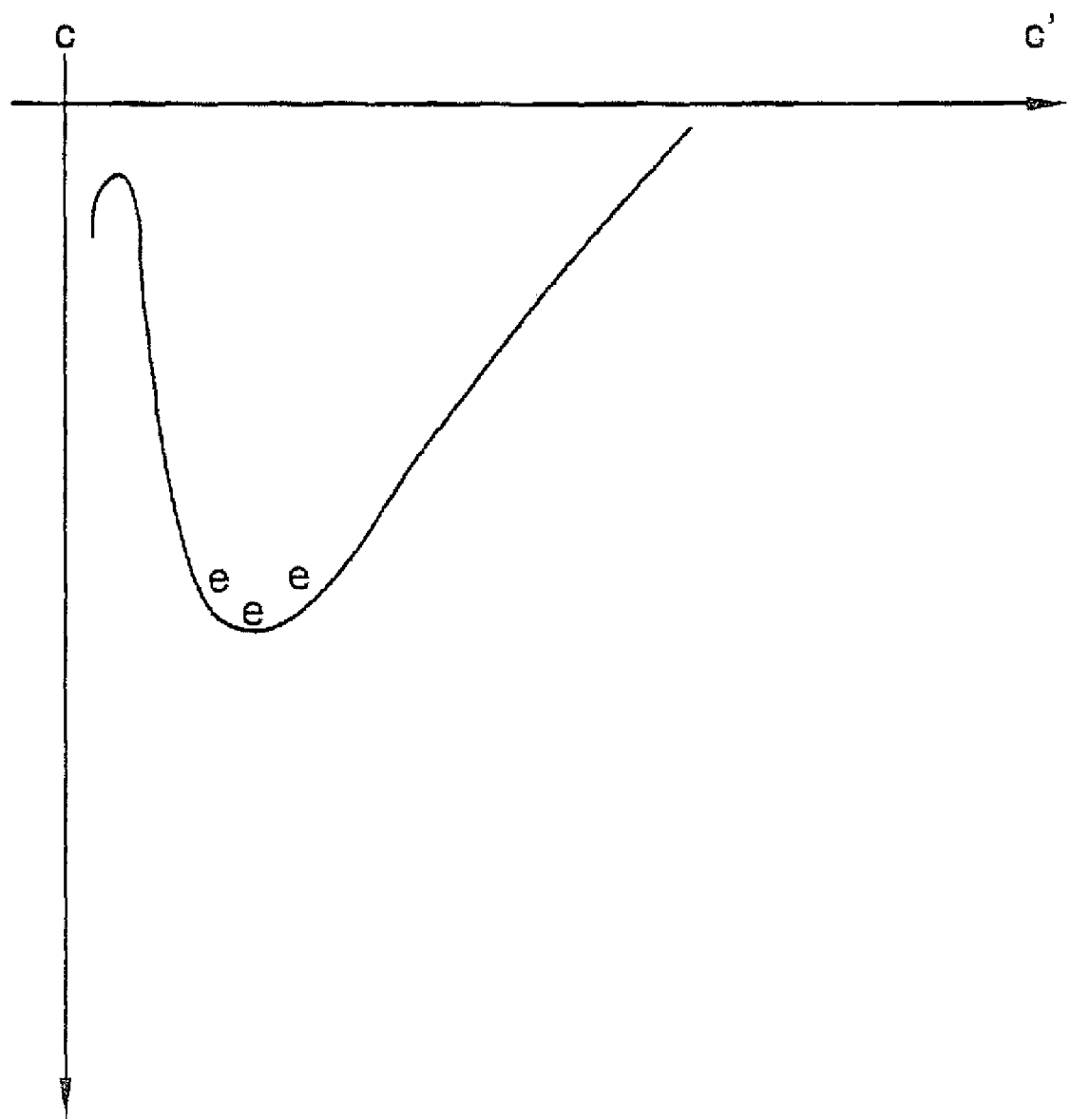
FIG. 7B is a potential diagram taken along the line c-c' of FIG. 7A.

FIG. 3A is a layout diagram illustrating color filters of an image sensor according to some embodiments. FIG. 3B is a schematic plan view illustrating an active pixel sensor array of an image sensor according to some embodiments. FIG. 4 is a cross-sectional view taken along the line I-I' of FIGS. 3A and 3B. FIG. 5A is a cross-sectional view taken along the line II-II' of FIGS. 3A and 3B. FIG. 5B is a potential diagram taken along the line a-a' of FIG. 5A. FIG. 6A is a cross-sectional diagram taken along the line III-III' of FIGS. 3A and 3B. FIG. 6B is a potential diagram taken along the line b-b' of FIG. 6A. FIG. 7A is a cross-sectional view taken along the line IV-IV' of FIGS. 3A and 3B. FIG. 7B is a potential diagram taken along the line c-c' of FIG. 7A.

Referring to FIGS. 3A and 3B, in an image sensor according to some embodiments, a plurality of unit pixels are disposed in a matrix, and a plurality of color filters are disposed to correspond to the plurality of unit pixels. In FIG. 3A, Bayer color filters are shown, but the present invention is not limited thereto. Unit pixels are disposed below red color filters R, green color filters G, and blue color filters B to correspond thereto. In some embodiments, unit pixels that correspond to the red color filters R, unit pixels that correspond to the green color filters G, and unit pixels that correspond to the blue color filters B are defined as red unit pixels 100R, green unit pixels 100G, and blue unit pixels 100B, respectively.

FIG. 4 is a cross-sectional view taken along the line I-I' of FIGS. 3A and 3B, which is a cross-sectional view of a red unit pixel 100R, a green unit pixel 100G, and a blue unit pixel 100B that are adjacent to each other. FIG. 5A, FIG. 6A, and FIG. 7A are cross-sectional views taken along the lines II-II', III-III', and IV-IV' of FIGS. 3A and 3B, which are cross-sectional views of a red unit pixel 100R, a green unit pixel 100G, and a blue unit pixel 100B.

In some embodiments, the image sensor includes a semiconductor substrate 101, a deep well 107, an element-separation region 109, and a plurality of unit pixels. It will be appreciated that the semiconductor substrate 101 could include, for example, a semiconductor layer on a supporting substrate, such as a semiconductor substrate or an insulating substrate. The plurality of unit pixels include red unit pixels 100R, green unit pixels 100G, and blue unit pixels 100B. The red unit pixel 100R, the green unit pixel 100G, and the blue unit pixel 100B include photoelectric-converting units 110R, 110G, and 110B, respectively. Each of the red unit pixel 100R, the green unit pixel 100G, and the blue unit pixel 100B further includes the charge-detecting unit 120 and the charge-transferring unit 130. In the present embodiment, pinned photodiodes (PPD) are used as the photoelectric-converting units 110R, 110G, and 110B, but the present invention is not limited thereto.

The semiconductor substrate 101 has a first conductive type (for example, N-type). The semiconductor substrate 101 is divided into lower and upper substrate regions 101a and 101b by a second conductive (for example, P-typed) deep well 107 that is formed at a predetermined depth of the semiconductor substrate 101. In the present embodiment, the semiconductor substrate 101 is N-type, but the present invention is not limited thereto.

The deep well 107 forms a potential barrier to prevent charges generated in a deep region of the lower substrate region 101a from flowing through the photoelectric-converting unit 110. The deep well 107 increases recombination between electrons and holes. Accordingly, the deep well 107 can decrease crosstalk between pixels due to random drift of the charges.

The deep well 107 may be formed such that it has the highest concentration at the depth of 3 to 12 μm from the surface of the semiconductor substrate 101, and has a layer thickness of 1 to 5 μm. In this case, the dimension that corresponds to the depth of 3 to 12 μm is substantially the same as the dimension of the absorption wavelength of red or near infrared region light in silicon. In this case, when the depth of the deep well 107 from the surface of the semiconductor substrate 101 is shallow, a diffusion-prevention effect is excellent, and thus crosstalk is decreased. However, since the depth of a region of the photoelectric-converting unit 110 becomes shallow, it is possible to lower sensitivity with respect to incident light that has a long wavelength (for example, red light), whose photoelectric conversion ratio is relatively large in deep regions. Accordingly, a location where the deep well 107 is formed may be adjusted according to a wavelength region of the incident light.

The element-separation region 109 is formed in the upper substrate region 101b and defines an activation region. In general, the element-separation region 109 can include a FOX (Field OXide) formed using an STI (Shallow Trench Isolation) or a LOCOS (Local Oxidation of Silicon) method. A second conductive (for example, P-typed) separation well (not shown) may be formed below the element-separation region 109.

Each of the photoelectric-converting units 100R, 100G, and 100B that are provided in the red unit pixel 100R, the green unit pixel 100G, and the blue unit pixel 100B includes a P+-type pinning layer 112 and an N-type first photodiode 114, which are formed in the semiconductor substrate 101.

The pinning layer 112 reduces a dark current by reducing electron-hole pairs (EHP) that are thermally generated in the upper substrate region 101b. Charges that are generated to correspond to incident light of each wavelength are accumulated in the first photodiode 114. Further, a maximum impurity concentration of the photodiode 114 may be $1 \times 10^{15}$ to $1 \times 10^{18}$ atom/cm$^3$, and a maximum impurity concentration of the pinning layer 112 may be $1 \times 10^{17}$ to $1 \times 10^{20}$ atom/cm$^3$. However, the present invention is not limited thereto, because the doped concentrations and locations may be changed according to manufacturing process and/or design considerations.

The photoelectric-converting unit 110R of the red unit pixel 100R includes a second photodiode 116. That is, the photoelectric-converting unit 110R of the red unit pixel 100R includes a pinning layer 112, a first photodiode 114, and a second photodiode 116.

The second photodiode 116 is N-type, and is formed below the first photodiode 114. The second photodiode 116 is formed to have a lower impurity concentration than the first photodiode 114. The red light, which is incident on the photoelectric-converting unit 110R of the red unit pixel 100R, is incident on a deep region of the semiconductor substrate 101. Red light has a wavelength of approximately 650 to 700 nm, and can penetrate to a deeper region of a semiconductor substrate than blue light or green light. The photoelectric-converting unit 110R of the red unit pixel JOUR includes not only the first photodiode 114 but also the second photodiode 116, which is provided below the first photodiode 114. Therefore, the photoelectric-converting unit 110R can store charges that are generated by a red wavelength, which can reach a deeper region of the substrate 101.

Light that reaches a deep region of the semiconductor substrate 101 may spread more in a horizontal direction than light absorbed in the upper region of the semiconductor substrate 101. For this reason, charges generated by the light that has reached the deep region of the semiconductor substrate 101, may more easily diffuse to neighboring regions of the substrate 101. The second photodiode 116 is formed to have a relatively large width in a horizontal direction rather than a vertical direction. Accordingly, charges generated by light that has reached the deep region of the semiconductor substrate 101 can be maximally stored, thereby reducing/preventing the charges from diffusing to the neighboring regions. In FIG. 4 and FIG. 5A, the second photodiode 116 has a larger width W1 than the first photodiode 114, but the present invention is not limited thereto.

FIG. 5B is a potential diagram taken along the line a-a' of FIG. 5A, which is a longitudinal potential diagram of a photoelectric-converting unit 110R of a red unit pixel 100R. Referring to FIG. 5B, as compared with the slope of the potential (displayed by the clotted line) when only the first photodiode 114 is provided, the slope of the potential (displayed by the solid line) when the first photodiode 114 and the second photodiode 116 are provided is flatter. Accordingly, electrons in a deeper region can also be captured. In this case, since an impurity concentration of the second photodiode 116 is lower than an impurity concentration of the first photodiode 114, the inclination of the potential is formed, as shown in FIG. 4B. The electrons that are generated in the deep region move upward due to the potential difference. Further, the electrons move to the charge-detecting unit via the charge-transporting unit.

When the impurity concentration in the second photodiode 116 is similar to that of the first photodiode 114, the slope of the potential may become even flatter (for example, may become horizontal). In this case, since the potential difference in the upper and lower regions of the semiconductor substrate 101 decreases, it may become difficult for the electrons in the deep region to move the upper region. That is, in the image sensor according to this embodiment, the second photodiode 116, which corresponds to an impurity region having a lower concentration than the first photodiode 114, is formed below the first photodiode 114 of the red unit pixel 100R. As a result, the electrons that are generated in the deep region can be captured, and the electrons that are captured by the second photodiode 116 can more easily move to the upper region of the semiconductor substrate 101 clue to the potential difference in the upper and lower regions of the semiconductor substrate 101.

The photoelectric-converting unit 110G of the green unit pixel 100G includes a third photodiode 118. That is, the photoelectric-converting unit 110G of the green unit pixel 100G includes a pinning layer 112, a first photodiode 114, and a third photodiode 118.

The third photodiode 118 is formed below the first photodiode 114, and has N-type conductivity like the first photodiode 114. The third photodiode 118 is formed to have a lower impurity concentration than the first photodiode 114. Further, the third photodiode 118 may be formed at substantially the same depth as the second photodiode 116. The green wavelength, which is incident on the photoelectric-converting unit 110G of the green unit pixel 100G, is incident on a deep region in the semiconductor substrate 101. Green light has a wavelength of approximately 490 to 550 nm, and penetrates to a shallower depth than red light, but deeper than blue light. The photoelectric-converting unit 110G of the green unit pixel 100G includes not only the first photodiode 114 but also the third photodiode 118, which is provided below the first photodiode 114. Therefore, the photoelectric-converting unit 110G can also store charges that are generated by green light, which can reach a deeper region.

The third photodiode 118 is formed to have a smaller width than the first and second photodiodes 114 and 116. In this case, the width of the third photodiode 118 means an area of the third photodiode 118 when the third photodiode 118 is cut in a horizontal direction at the same level. Since FIGS. 4, 6A, and 7A are cross-sectional views, the width W1 of the second photodiode 116 and the width W2 of the third photodiode 118 are shown. It is more difficult for green light to penetrate to the deep region of the semiconductor substrate 101, as compared with red light. Accordingly, the amount of charges generated in the deep region of the green unit pixel 100G, may be smaller than the amount of charges generated in the deep region of the red unit pixel 100R. Thus, even though the width of the third photodiode 118, which is formed in the photoelectric-converting unit 110G of the green unit pixel 100G, is smaller than the width of the second photodiode 116, which is formed in the photoelectric-converting unit 110R of the red unit pixel 100R, it is possible to sufficiently capture electrons that are generated in the deep region of the green unit pixel 100G. Since the third photodiode 118 is formed to have a smaller width than the first and second photodiodes 114 and 116, the distance (W3 of FIG. 4) in a horizontal direction between the third photodiode 118 and the second photodiode 116, which is formed adjacent to the third photodiode 118, is increased.

In the deeper region of the semiconductor substrate 101, impurity regions can more easily diffuse, as compared with the upper region of the semiconductor substrate 101. Because of the diffusion of the impurity regions, blooming occurs, thereby lowering the reliability of the image sensor. Accordingly, when the distance between the impurity regions and the deep region is increased, the reliability of the image sensor can be improved. In the present embodiment, in the image sensor, the photoelectric-converting unit 110G of the green unit pixel 100G includes a third photodiode 118 that is formed below the first photodiode 114. Accordingly, the width of the third photodiode 118 can be decreased while the electrons formed in the deep region are captured, and thus the diffusion of impurities and blooming can be reduced. As a result, it is possible to improve the reliability of the image sensor.

FIG. 6B is a potential diagram taken along the line VIB-VIB of FIG. 6A, which is a longitudinal potential diagram of a photoelectric-converting unit 110G of a green unit pixel 100G. Referring to FIG. 6B, as compared with an inclination of the potential (displayed by a dotted line) of when the first photodiode 114 is only provided, a slope of the potential (displayed by a solid line) of when the first photodiode 114 and the second photodiode 116 are provided is flatter. Accordingly, it can be confirmed that electrons in a deeper region can also be captured. When the third photodiode 118 is formed at substantially the same depth as the second photodiode 116, the potential diagram of the photoelectric-converting unit 110G of the green unit pixel 100G may be similar to the potential diagram of the photoelectric-converting unit 110R of the red unit pixel 100R, as shown in FIGS. 5B and 6B. However, the present invention is not limited thereto.

The photoelectric-converting unit 110B of the blue unit pixel 100B includes a pinning layer 112 and a first photodiode 114. In the photoelectric-converting unit 110B of the blue unit pixel 100B, the same conductive impurity region as the first photodiode 114 is not provided below the first photodiode 114.

Blue light has a wavelength of approximately 430 to 480 nm. Since the blue wavelength is short, the blue wavelength may penetrate less deeply into the semiconductor substrate 101. Approximately 80% or more of blue light may be absorbed in the surface of the semiconductor substrate 101 at the depth of approximately 0.5 μm or less, and almost all the blue wavelength may be absorbed at the depth of approximately 2 μm or less. If the depth of the first photodiode 114 is in a range of approximately 1 to 5 μm, almost all the blue wavelength is absorbed in the first photodiode 114. Accordingly, a separate impurity region may not need to be formed below the first photodiode 114.

FIG. 7B is a potential diagram taken along the line c-c' of FIG. 7A, which is a longitudinal potential diagram of a photoelectric-converting unit 110B of a blue unit pixel 100B. Referring to FIG. 7B, it can be understood that a slope of the potential (displayed by a solid line) of the photoelectric-converting unit 110B of the blue unit pixel 100B, where only the first photodiode 114 is provided, is large, as compared with those shown in FIGS. 5B and 6B. That is, charges that are generated in the deep region of the semiconductor substrate 101 may not be captured in the photoelectric-converting unit 110B of the blue unit pixel 100B. Accordingly, even when there are electrons that have moved from the adjacent red unit pixel 100R or the adjacent green unit pixel 100G, the electrons may not be captured by the photoelectric-converting unit 110B of the blue unit pixel 100B.

That is, in some embodiments, in the green unit pixel 100G of the image sensor, the first photodiode 114 may capture electrons that are generated from blue light, but may not capture electrons that have moved from an adjacent unit pixel. As a result, it is possible to improve color reproducibility.

Referring to FIGS. 5A, 6A and 7A, the charge-detecting unit 120 is formed in the semiconductor substrate 101, and receives the charges accumulated in the photoelectric-converting units 110R, 110G, and 110B through the charge-transferring unit 130. The charge-transferring unit 130 includes an impurity region 132, a gate insulating layer 134, a gate electrode 136, and a spacer 138.

The impurity region 132 can reduce a dark current that can be generated regardless of an image that is sensed in a state where the charge-transferring unit 130 is turned off. The impurity region 132 is formed adjacent to the surface of the upper substrate region 101b, and reduces the dark current. The impurity region 132 may be formed at a depth of, for example, 2000 Å or less.

The gate insulating layer 134 may be made of $SiO_2$, SiON, SiN, $Al_2O_3$, $Si_3N_4$, $Ge_xO_yN_z$, $Ge_xSi_yO_z$, and/or high dielectric materials. In this case, the high dielectric materials may be formed by an atomic layer deposition method using $HfO_2$, $ZrO_2$, $Al_2O_3$, $Ta_2O_5$, hafnium silicate, zirconium silicate, and/or a combination thereof. Further, the gate insulating layer 134 may be configured by laminating two or more materials selected from the materials of the exemplified layers as a plurality of layers. The gate insulating layer 134 may be formed to have a thickness in the range of 5 to 100 Å.

The gate electrode 136 may include a metal film, such as a conductive polysilicon film, W, Pt, or Al, a metal nitride film, such as TiN, a metal silicide film that is obtained from a refractory metal, such as Co, Ni, Ti, Hf, and Pt, and/or a combination thereof. Alternatively, the gate electrode 136 may be formed by sequentially laminating a conductive polysilicon film and a metal silicide film, or a conductive polysilicon film and a metal film. However, the present invention is not limited thereto.

The spacer 138 is formed at both sidewalls of the gate electrode 136, and may include a nitride film (SiN).

FIGS. 8A to 10 are diagrams illustrating methods of manufacturing an image sensor according to some embodiments. Methods of manufacturing an image sensor according to some embodiments will be described with reference to FIGS. 3B, 4A, 4B, and 8A to 10.

Figure 8A:
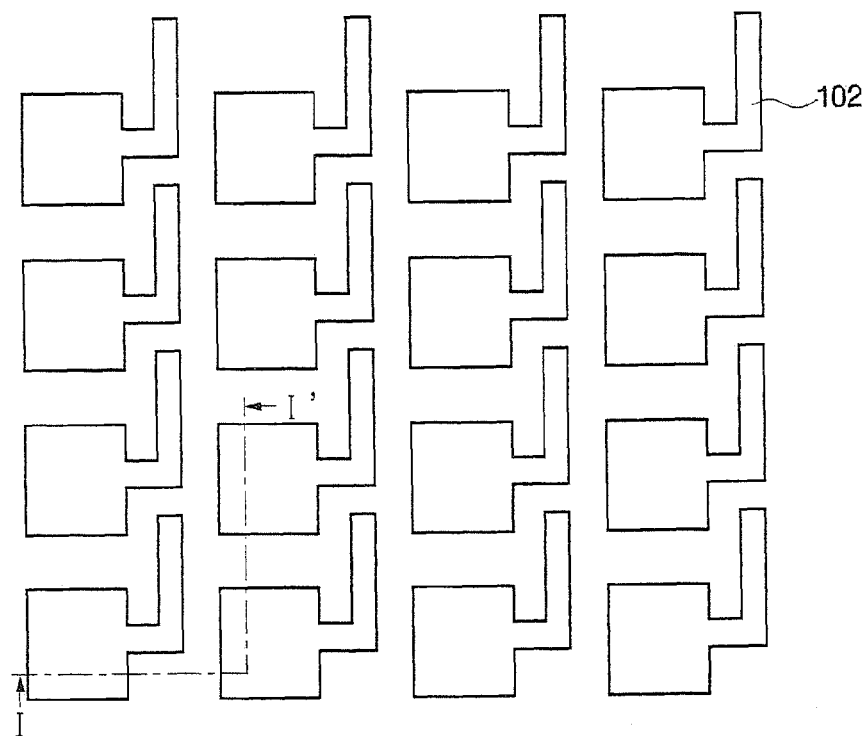
FIGS. 8A, 8B, 9A-9C and 10 are diagrams illustrating methods of manufacturing an image sensor according to some embodiments.
Figure 8B:
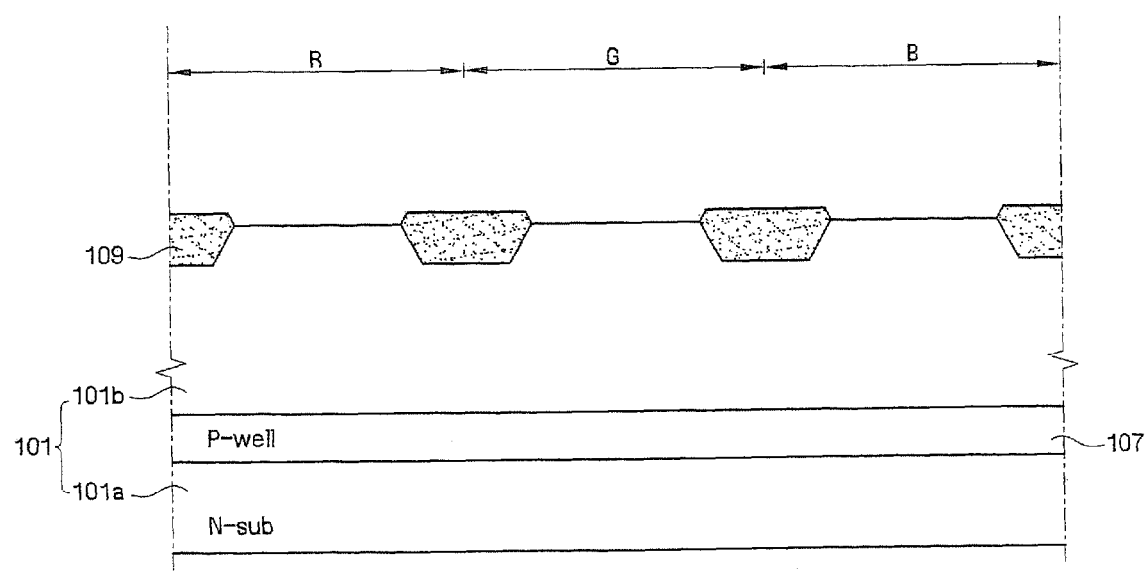

First, referring to FIGS. 8A and 8B, impurities are implanted into a predetermined region of the semiconductor substrate 101 of the first conductive type to form the deep well 107. The element-separation region 109 is formed to define an active region 102 where pixels and peripheral circuits are to be formed.

At this time, regions where red unit pixels, green unit pixels, and blue unit pixels are formed are defined in the semiconductor substrate 101. In FIG. 8B, reference character R denotes a red unit pixel region, reference character G denotes a green unit pixel region, and reference character B denotes a blue unit pixel region.

When an N-type substrate is used, the deep well 107 may be formed by implanting a second conductive ion, different from the conductivity of the semiconductor substrate 101. Further, impurities may be implanted below the element-separation region 109, thereby forming a separation well (not shown) to reduce crosstalk in a horizontal direction.

Figure 9A:
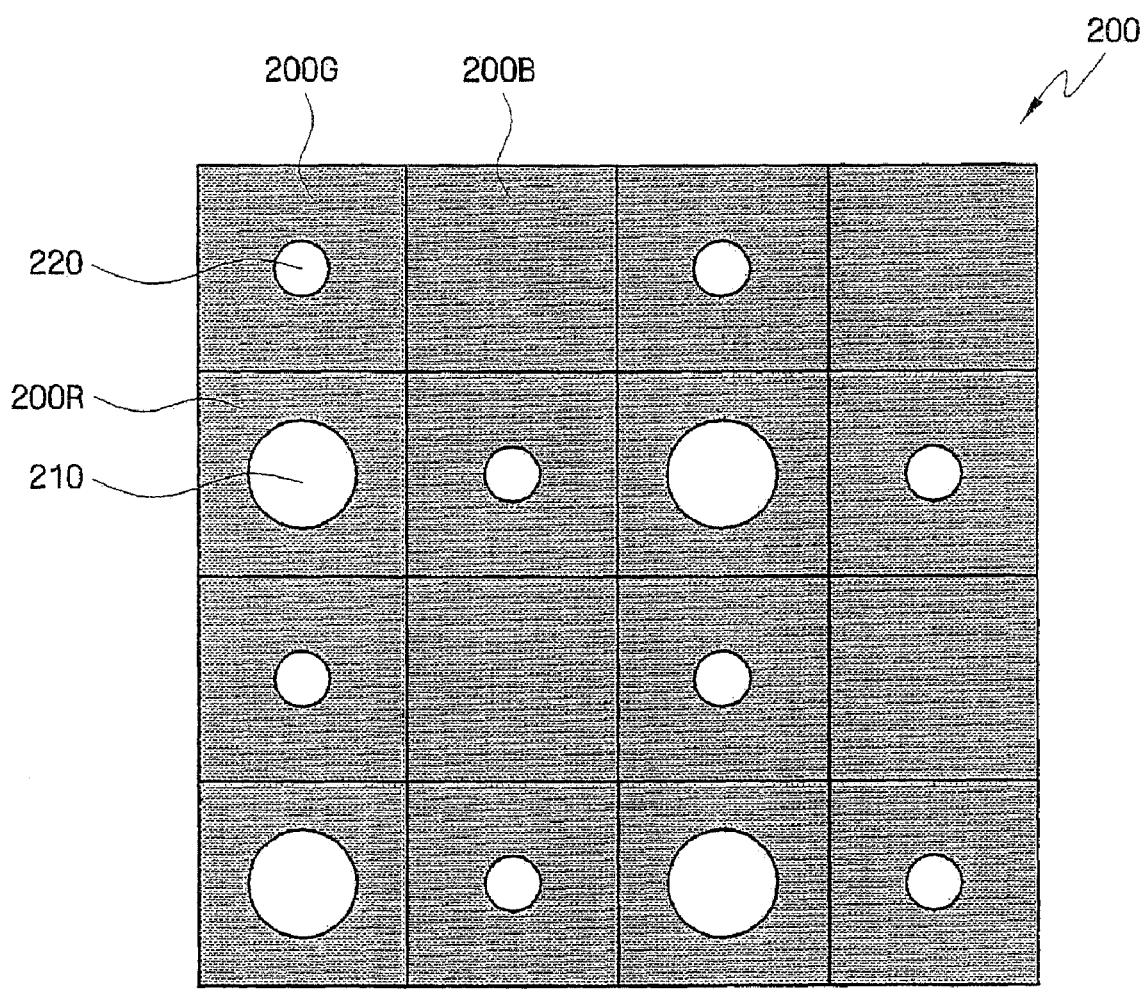
Figure 9B:
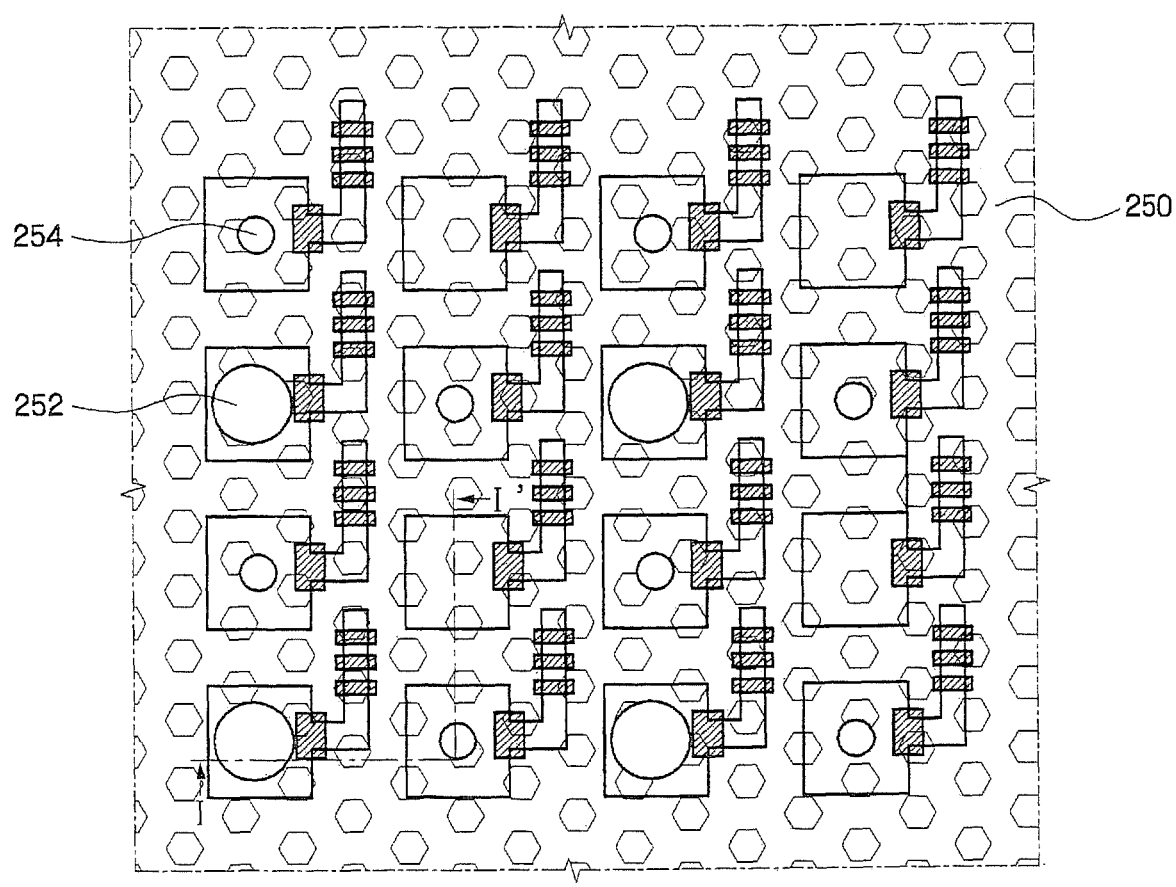
Figure 9C:
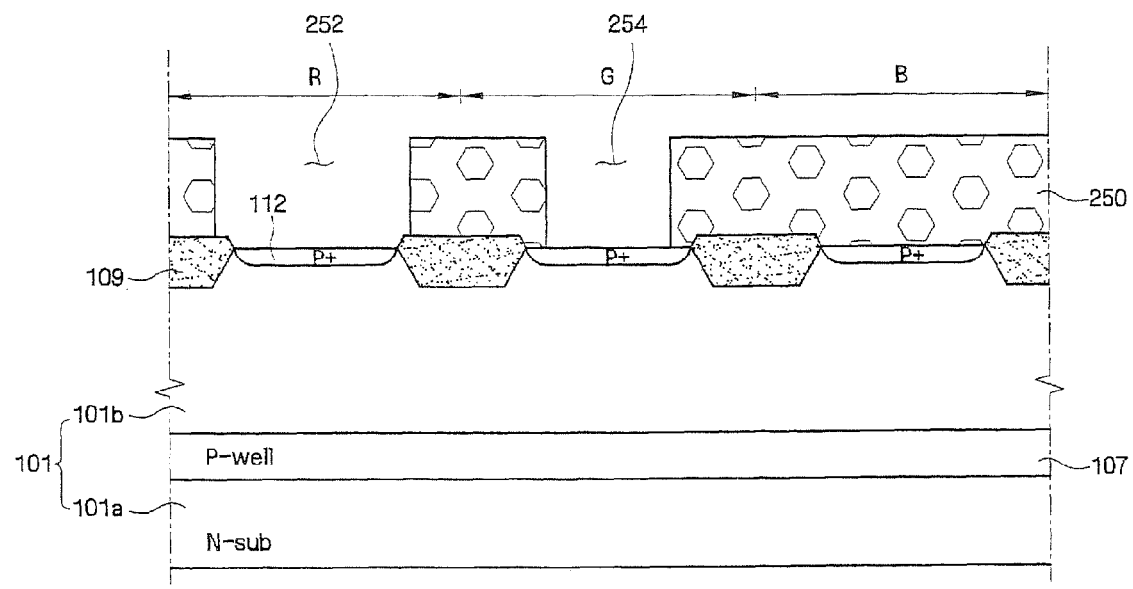

Then, referring to FIGS. 9A to 9C, a mask pattern 250, where first openings 252 are formed in the red unit pixel regions and second openings 254 are formed in the green unit pixel regions, is formed on the semiconductor substrate 101.

FIG. 9A shows an optical mask 200 that may be used to form the mask pattern 250. The optical mask 200 includes first light-transmitting portions 210 that are formed in regions 200R corresponding to the red unit pixel regions and second light-transmitting portions 220 that are formed in regions 200G corresponding to the green unit pixel regions. The first light-transmitting portion 210 may be formed to have a larger area than the second light-transmitting portion 220, and light-transmitting portions may not be formed in regions 200B corresponding to the blue unit pixel regions.

Specifically, a mask layer, for example, a photoresist layer is formed on the semiconductor substrate 101, and then a photolithography process is performed by using the optical mask 200 shown in FIG. 9A, thereby forming the mask pattern 250. As a result, in the mask pattern 250, the first openings 252 are formed in the regions that correspond to the first light-transmitting portions 210, and the second openings 254 are formed in the regions that correspond to the second light-transmitting portions 220. That is, the first opening 252 is formed in the red unit pixel region 200R, and the second opening 254 is formed in the green unit pixel region 200G. At this time, the first opening 252 is formed to have a larger area than the second opening 254.

Referring to FIGS. 9B and 9C, before forming the mask pattern 250, transistors including charge-transferring units and a pinning layer 112 are formed. However, the present invention is not limited thereto. After forming the mask pattern 250, the transistors including the charge-transferring units and the pinning layer 112 may be formed.

Figure 10:
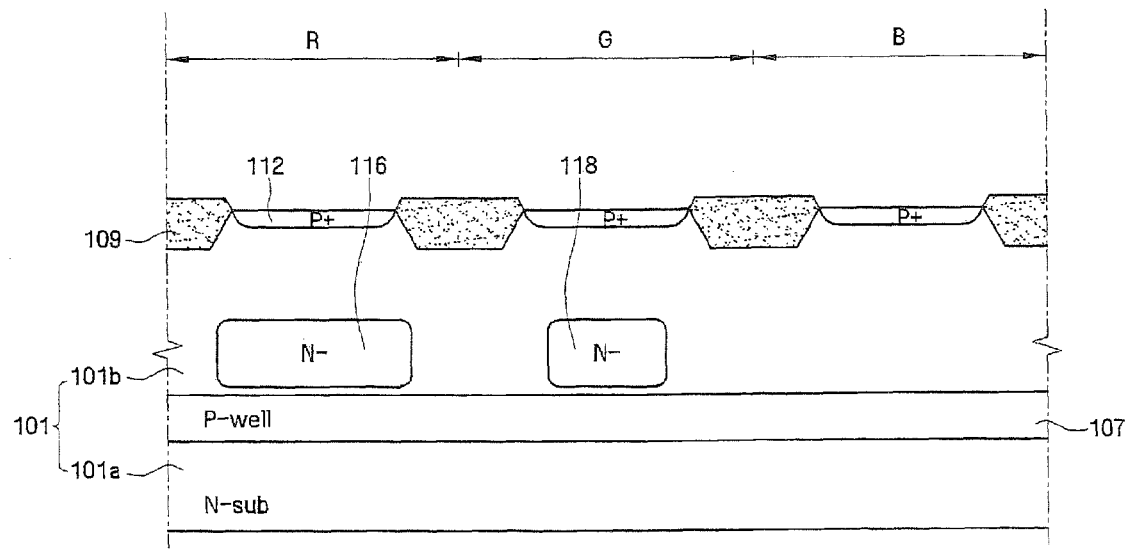

Then, referring to FIG. 10, the mask pattern (refer to reference numeral 250 of FIG. 9C) is used as an ion implantation mask and an ion implantation process is performed, thereby forming the second photodiode 116 and the third photodiode 118.

At this time, since the area of the first opening (refer to reference numeral 252 of FIG. 9C) is larger than the area of the second opening (refer to reference numeral 254 of FIG. 9C), the second photodiode 116 is formed to have a larger width than the third photodiode 118. Further, since the second photodiode 116 and the third photodiode 118 are formed by the same ion implantation process, ion implantation energy and a dose of implanted ions are the same. Accordingly, the second photodiode 116 and the third photodiode 118 can be formed with the same concentration at substantially the same depth.

Then, referring to FIGS. 3B and 4A and 4B, the first photodiodes 114 are formed in the red unit pixel regions, the green unit pixel regions, and the blue unit pixel regions.

The first photodiode 114 is formed on the second and third photodiodes 116 and 118, and may be formed to be substantially the same type in the red, green, and blue unit pixel regions.

Then, the red unit pixel 100R, the green unit pixel 100G, and the blue unit pixel 100B are finished using processes known to those skilled in the art.

In some embodiments, the first photodiode 114 is formed after forming the second and third photodiodes 116 and 118 that are located in the deeper region, but the present invention is not limited thereto. That is, the second and third photodiodes 116 and 118 may be formed after forming the first photodiode 114.

According to some embodiments, the regions of the second and third photodiodes 116 and 118 are formed in the photoelectric-converting unit 110R of the red unit pixel 100R and the photoelectric-converting unit 110G of the green unit pixel 100G, respectively, to capture electrons that are generated by a wavelength absorbed in the deep region of the semiconductor substrate 101, thereby improving color reproducibility. Since the width of the second photodiode 116 of the red unit pixel 100R where the light reaching the deep region has a large wavelength is larger than the width of the third photodiode 118, it is possible to efficiently capture electrons. Further, since the width of the third photodiode 118 is smaller than the width of the second photodiode 116, the spacing between the second photodiode 116 and the third photodiode 118 can be relatively increased. Further, in the region of the blue unit pixel 100B where the electrons in the deep region do not need to be captured, the impurity region may not be formed. Accordingly, it is possible to efficiently capture electrons in the deep region while reducing/preventing the "blooming" phenomenon that can occur when impurity regions that are formed in the deep region of the semiconductor substrate 101 diffuse toward each other. Therefore, it is possible to improve the reliability of the image sensor.

According to some embodiments, the second and third photodiodes 116 and 118 are formed by performing a photolithography process using a single optical mask one time. That is, impurity regions whose widths are different from each other are formed by performing a photolithography process once, thereby improving productivity.

Figure 11:
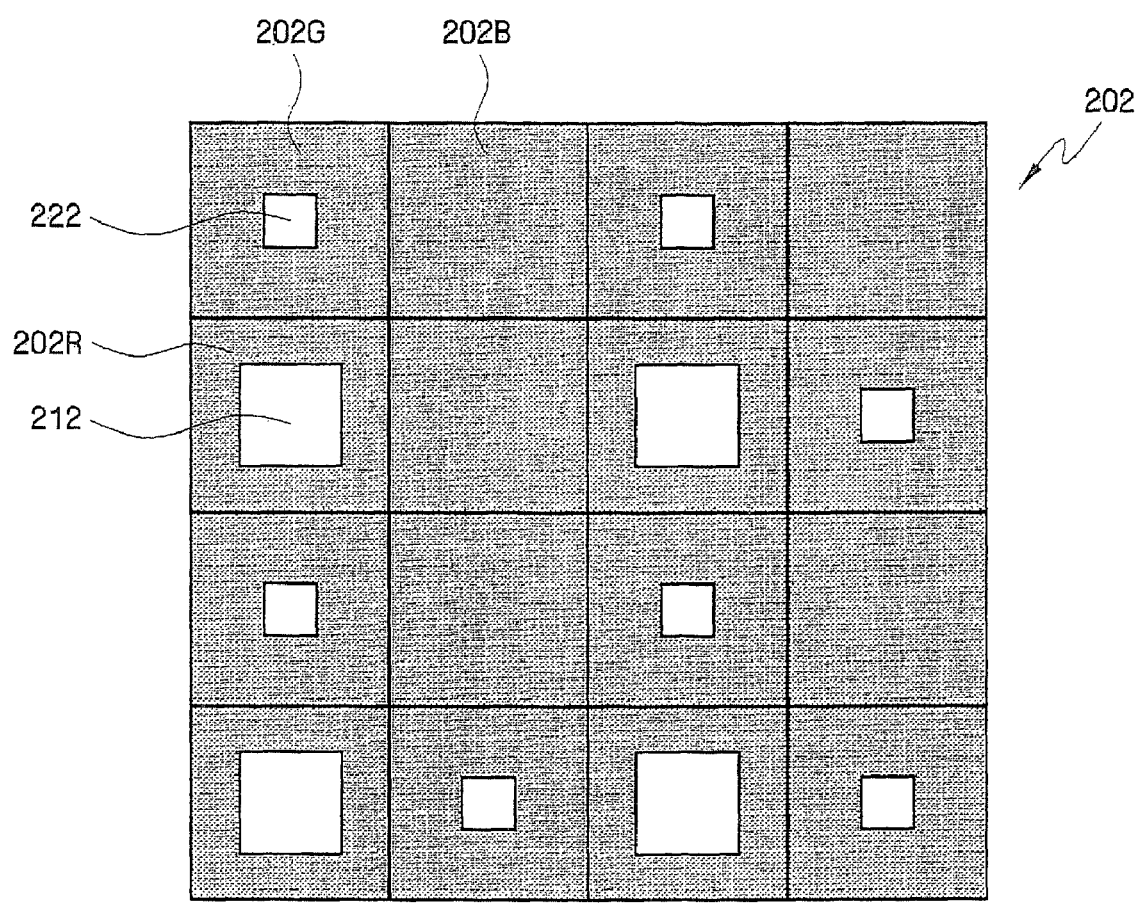
FIGS. 11 and 12 are diagrams illustrating optical masks that can be used in methods of manufacturing an image sensor according to some embodiments.
Figure 12:
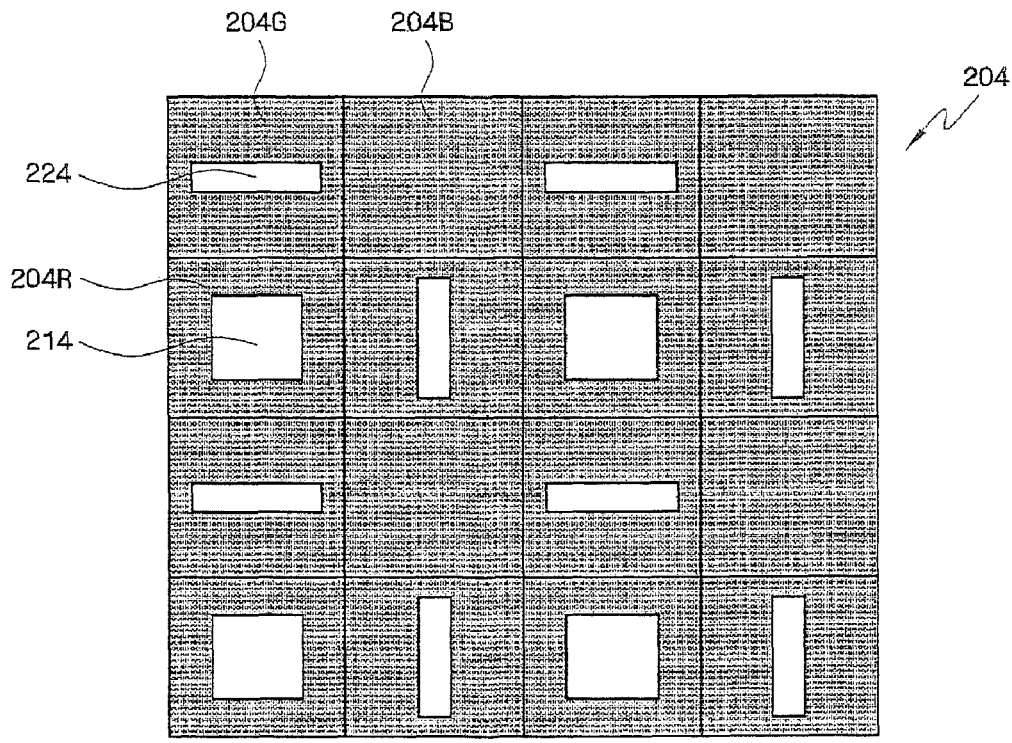

FIGS. 11 and 12 are diagrams illustrating optical masks that can be used in methods of manufacturing an image sensor according to some embodiments.

The optical mask 202 shown in FIG. 11 is different from the optical mask 200 shown in FIG. 9A in that each of first and second light-transmitting portions 212 and 222 is formed in a rectangular shape. However, the first and second openings 212 and 222 are not limited thereto, and may have all polygonal types. That is, the first and second openings 212 and 222 include all types in which the area of the first light-transmitting portion 212 is larger than the area of the second light-transmitting portion 222. In this case, reference numeral 202R denotes a region that corresponds to the red unit pixel region, reference numeral 202G denotes a region that corresponds to the green unit pixel region, and reference numeral 202B denotes a region that corresponds to the blue unit pixel region.

The optical mask 204 shown in FIG. 12 is different from the optical mask 200 shown in FIG. 9A in that the first light-transmitting portion 214 is formed in a square shape and the second light-transmitting portion 224 is formed in a rectangular shape.

The second light-transmitting portion 224, which is formed in the region 204G corresponding to the green unit pixel region shown in FIG. 12, is separated from the first light-transmitting portion 214 that is formed in the region 204R that corresponds to the red unit pixel region. As a result, it is possible to increase an interval between the second photodiode, which is to be formed to correspond to the first light-transmitting portion 214, and the third photodiode, which is to be formed to correspond to the second light-transmitting portion 224. Meanwhile, the second light-transmitting portion 224 is formed to extend along the region 204B that corresponds to the blue unit pixel region where impurity regions do not exist at the same level. That is, the second light-transmitting portion 224 extends along the region 204B that corresponds to the blue unit pixel region where the impurity regions do not exist at the same level, and it is not likely for the impurity regions to diffuse to the adjacent impurity regions. Therefore, it is possible to further capture the electrons that are generated in the deep region.

Figure 13:
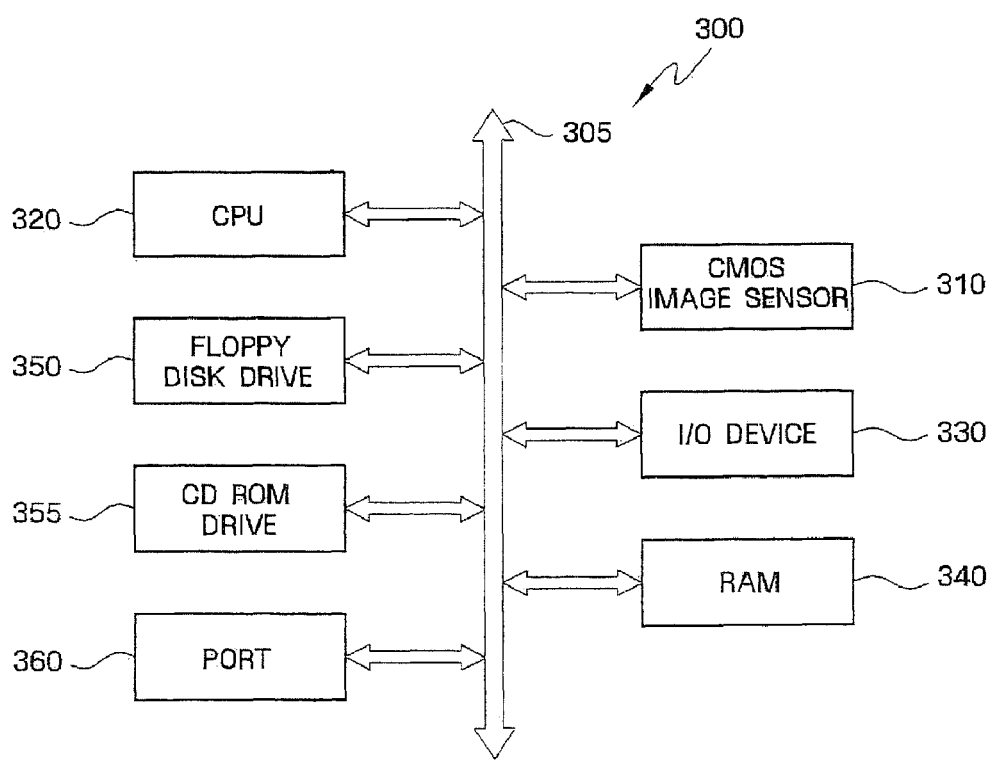
FIG. 13 is a schematic diagram illustrating a system based on a processor that includes an image sensor according to some embodiments.

FIG. 13 is a schematic diagram illustrating a system based on a processor that includes an image sensor according to embodiments of the present invention.

Referring to FIG. 13, a processor-based system 300 processes an output image of a CMOS image sensor 310. Examples of the processor-based system 300 may include a computer system, a camera system, a scanner, a mechanized clock system, a navigation system, a video phone, a supervising system, an auto-focusing system, a tracking system, an operation-monitoring system, and an image-stabilizing system. However, the present invention is not limited thereto.

The processor-based system 300, such as the computer system, includes a central processing unit (CPU) 320, such as a microprocessor, which is capable of communicating with an input/output (IO) element 330 through a bus 305. The CMOS image sensor 310 can communicate with a system through the bus 305 or another communication link. The processor-based system 300 may further include a RAM 340 that can communicate with the CPU 320 through the bus 305, a floppy disk drive 350 and/or a CD ROM drive 355, and a port 360. The port 360 can couple a video card, a sound card, a memory card, and a USB element, or exchange data with another system. The CMOS image sensor 310 can be integrated together with a CPU, a digital signal processing device DSP or a microprocessor. The CMOS image sensor 310 can be integrated together with a memory. In some cases, the CMOS image sensor 310 can be integrated in a chip different from the processor.

According to some embodiments, an image sensor includes a red unit pixel including first and second photodiodes, and a green unit pixel including first and third photodiodes. The second and third photodiodes are formed in the photoelectric-converting units of the red unit pixel and the green unit pixel, respectively, to capture the electrons that are generated by the wavelength absorbed in a deep region of the semiconductor substrate, thereby improving color reproducibility. The width of the second photodiode of the red unit pixel where the light reaching the deep region has a long wavelength is larger than the width of the third photodiode. As a result, the spacing between the second photodiode and the third photodiode is relatively large and the impurity regions may not need to be separately formed in the blue unit pixel region. Accordingly, electrons in the deep region can be efficiently captured while it is possible to reduce or prevent the blooming phenomenon that can occur when impurity regions that are formed in the deep region of the semiconductor substrate diffuse, thereby improving the reliability of the image sensor.

Further, the second and third photodiodes can be formed by performing a photolithography process using a single optical mask one time. That is, impurity regions whose widths are different from each other can be formed by performing a photolithography process once, thereby improving productivity.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:
1. An image sensor comprising:
a semiconductor layer; and
a plurality of unit pixels including red unit pixels, green unit pixels, and blue unit pixels in the semiconductor layer,
wherein the red, green, and blue unit pixels are configured to accumulate charges corresponding to incident light having wavelengths in the red, green, and blue regions, respectively,
each of the plurality of unit pixels includes a first impurity region of a first conductivity type that is configured to accumulate charges corresponding to incident light of a respective wavelength,
the red unit pixels include second impurity regions of the first conductivity type below the first impurity regions, and
the green unit pixels include third impurity regions of the first conductivity type below the first impurity regions and at about an equal depth as the second impurity regions, a width of the third impurity regions is smaller than a width of the second impurity regions.

2. The image sensor of claim 1, wherein an impurity concentration of the first impurity regions is higher than an impurity concentration of the second impurity regions and an impurity concentration of the third impurity regions.

3. The image sensor of claim 1, wherein an impurity concentration of the second impurity regions and the third impurity regions is about equal.

4. The image sensor of claim 1, wherein:
the first impurity regions are spaced apart from each other, and
a spacing between adjacent ones of the first impurity regions is smaller than a spacing between adjacent ones of the second impurity regions and the third impurity regions.

5. The image sensor of claim 1, wherein a width of the third impurity regions is smaller than a width of the first impurity regions.

* * * * *